United States Patent
Tanaka

(10) Patent No.: US 6,841,452 B2
(45) Date of Patent: Jan. 11, 2005

(54) METHOD OF FORMING DEVICE ISOLATION TRENCH

(75) Inventor: Hiroyuki Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/673,429

(22) Filed: Sep. 30, 2003

(65) Prior Publication Data

US 2004/0110383 A1 Jun. 10, 2004

(30) Foreign Application Priority Data

Dec. 5, 2002 (JP) ........................................ 2002-353778

(51) Int. Cl.$^7$ ............................................. H01L 21/302
(52) U.S. Cl. ..................... 438/424; 438/426; 438/427; 438/696; 438/700; 438/734; 438/750
(58) Field of Search ................. 438/424, 426, 438/427, 696, 700, 734, 750

(56) References Cited

U.S. PATENT DOCUMENTS

| 5,177,576 | A | | 1/1993 | Kimura et al. |
| 5,629,226 | A | * | 5/1997 | Ohtsuki ....................... 438/389 |
| 6,015,985 | A | * | 1/2000 | Ho et al. ..................... 257/301 |
| 6,232,202 | B1 | * | 5/2001 | Hong .......................... 438/424 |
| 6,238,996 | B1 | * | 5/2001 | Liu et al. ..................... 438/400 |

FOREIGN PATENT DOCUMENTS

| JP | 05-029283 | 2/1993 |
| JP | 06-037275 | 2/1994 |
| JP | 2001-057382 | 2/2001 |

* cited by examiner

Primary Examiner—George A. Goudreau
(74) Attorney, Agent, or Firm—Rabin & Berdo, P.C.

(57) ABSTRACT

A silicon oxide film having a ununiform thickness is deposited inside each of trenches defined in a silicon substrate by etching within a device isolation region, in such a manner that only corner portions of trench bottoms are exposed. The silicon substrate is selectively etched from the exposed trench corner portions of the silicon substrate lying inside the trenches to thereby increase the volume of each trench.

14 Claims, 3 Drawing Sheets

METHOD OF FORMING DEVICE ISOLATION TRENCH

BACKGROUND OF THE INVENTION

1. Field of the Invention

The present invention relates to a method of manufacturing a semiconductor device having device isolation regions, and particularly to a method of forming device isolation using trenches.

2. Description of the Related Art

With micro-fabrication of a semiconductor device such as a DRAM (Dynamic Access Memory) or the like, device isolation other than device isolation carried out by conventional selective oxidation has recently been performed by an STI (Shallow Trench Isolation) technology (refer to Japanese Patent Application Laid-Open No. 2001-57382). The STI technology is intended to embed an insulating film such as an oxide film or the like in each of trenches defined in a semiconductor substrate such as silicon to thereby form a device isolation region.

However, a sufficient electrical device isolation withstand voltage was not necessarily obtained in the conventional trench device isolation. The device isolation withstand voltage depends on the shortest distance of a silicon region extending along each trench defined between adjacent devices. However, in order to make it possible to increase the distance of the silicon region, for example, the depth of each trench is made deep and the distance between the adjacent devices is made long. However, the conventional etching technology encountered difficulties in forming scaled-down trenches deeply with satisfactory control and without damage thereto and had limitations to improvements in isolation withstand voltage.

Therefore, although a technology (see Japanese Patent Application Laid-Open No. Hei 5(1993)-29283) for forming trenches different in shape as in obliquely-shaped ones, for example is also considered, it encounters a difficulty in etching or a difficulty in micro-fabrication or scale-down. Further, the application of a method of isotropically etching the bottom of each trench capacitor over its entirety to thereby widen the bottom is also considered. Since, however, an upper portion of each trench is also etched in the case of this method, it was difficult to enhance device isolation characteristics without changing a device active region.

SUMMARY OF THE INVENTION

The present invention has been made to solve the foregoing problems. The present invention aims to form an insulating film having an ununiform thickness inside trenches defined in a silicon substrate so that only trench corner portions of trench bottoms are exposed within the trenches, selectively etch the silicon substrate from the exposed trench corner portions of the silicon substrate and thereby etch only the trench bottoms.

It is also feasible to deposit the insulating film such that the corner portions of the trench bottoms become thin, thereafter etch the surface of the insulating film and thereby expose the silicon substrate at the corner portions of the trench bottoms.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE INVENTION

Figure 1:
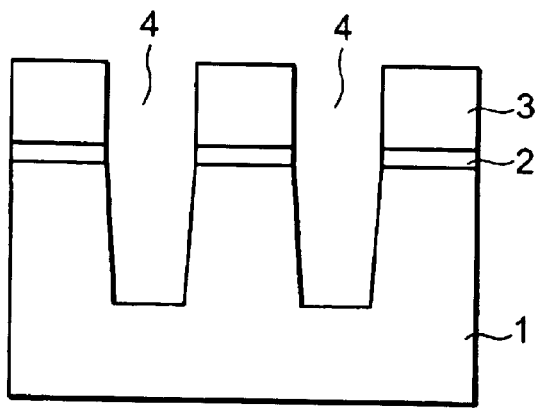
FIG. 1 is a process sectional view for forming a trench device isolation region, which is used for describing a first embodiment of the present invention.
Figure 2:
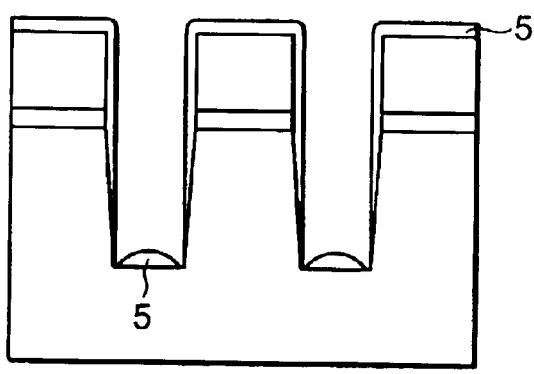
FIG. 2 is a process sectional view for forming the trench device isolation region, which is used for describing the first embodiment of the present invention in succession to FIG. 1.
Figure 3:
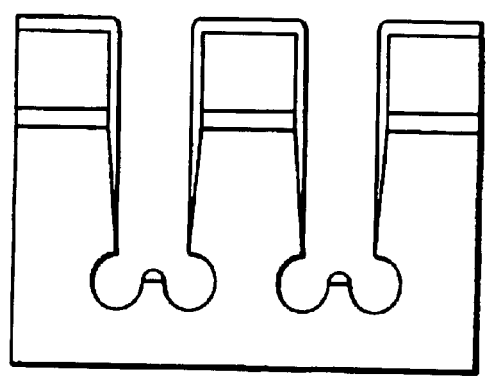
FIG. 3 is a process sectional view for forming the trench device isolation region, which is used for describing the first embodiment of the present invention in succession to FIG. 2.
Figure 4:
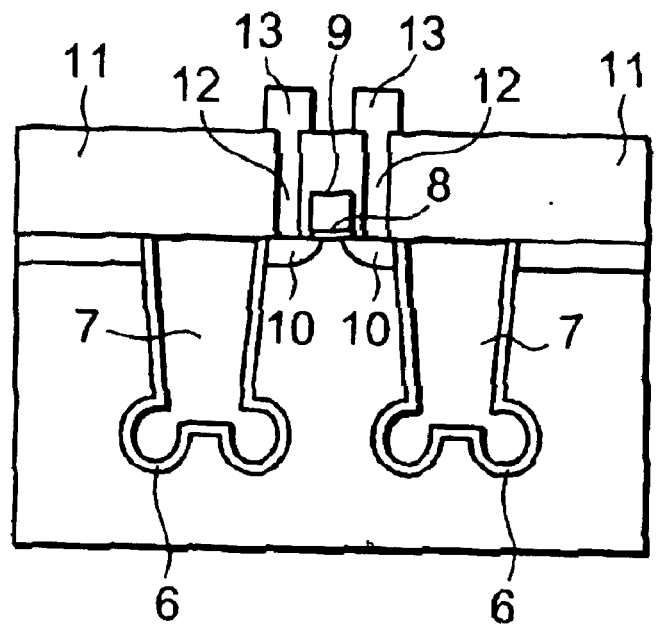
FIG. 4 is a process sectional view for forming the trench device isolation region, which is used for describing the first embodiment of the present invention in succession to FIG. 3.

Preferred embodiments of the present invention will hereinafter be described in detail with reference to the accompanying drawings.

The present invention has been made to solve the foregoing problems. The present invention intends to form an insulating film having an ununiform thickness inside trenches defined in a silicon substrate such that only trench corner portions of trench bottoms are exposed within the trenches, selectively etch the silicon substrate from the exposed trench corner portions of the silicon substrate and thereby etch only the trench bottoms.

It is also feasible to deposit the insulating film such that the corner portions of the trench bottoms become thin, thereafter etch the surface of the insulating film and thereby expose the silicon substrate at the corner portions of the trench bottoms.

FIGS. 1 through 4 show a first embodiment of the present invention. A silicon thermal oxide film 2 of about 15 nm is formed over the entire surface of a silicon substrate 1 according to a process similar to the conventional one. A silicon nitride film 3 of about 200 nm is deposited thereon by a CVD method. Thereafter, trenches 4 of 400 nm are respectively defined in a device isolation region of the silicon substrate by desired depths, e.g., in the substrate by a photolithography method and a dry etching method (see FIG. 1).

Thereafter, a thin silicon oxide film 5 of about 20 nm is deposited over the entire surface by a sputtering method or a plasma CVD method. At this time, a sputtering film or a CVD oxide film is controlled to a non-conformal deposition characteristic, so that it can be deposited so as to expose trench bottom corner portions alone. For example, a TEOS (tetraethylorthsilicate) film formed by a plasma CVD method using silane ($SiH_4$) and oxygen ($O_2$) gases is deteriorated in coverage within each trench and hence the film become hard to grow at the trench bottom corner portions, so that only the trench bottom corner portions can be exposed or thinned (see FIG. 2).

When the silicon substrate is not exposed after the deposition of the silicon oxide film 5, the deposited silicon oxide film may be removed by a wet etching method until only the trench bottoms are exposed. Further, the exposed silicon substrate at each trench bottom corner portion is selectively wet-etched by a solution of hydrofluoric nitric acid to isotropically remove the silicon substrate 1 at each trench bottom corner portion. As a result, trench shapes expanded at the bottoms are obtained (see FIG. 3).

Net, the silicon oxide film 5 deposited over the whole surface of the silicon substrate 1 is removed by using a hydrofluoric acid solution and a silicon thermal oxide film 6 of about 300 nm is formed. Thereafter, a silicon oxide film 7 of about 600 nm is deposited over the whole surface by a CVD method to bury the trenches 4. The silicon oxide film 2 and silicon nitride film 3 deposited over the silicon substrate 1 are removed by polishing through the use of a CMP method. Further, a MOS type transistor having a gate oxide film 8, a gate electrode 9 and source/drain diffusion layers 10, interlayer insulating films 11, contact holes 12 and connecting wirings 13 are formed by a method perfectly similar to the conventional method (see FIG. 4).

According to the first embodiment as described above, a silicon substrate exposed at each trench bottom corner portion within each of trenches defined in the silicon substrate for the purpose of device isolation is isotropically etched. Consequently, the shortest distance between silicon substrate regions extending along the trenches defined between devices can be made long even if dry etching similar to the conventional one is used for trench formation. As a result, the MOS type transistor can be improved in device-isolation withstand voltage.

Figure 5:
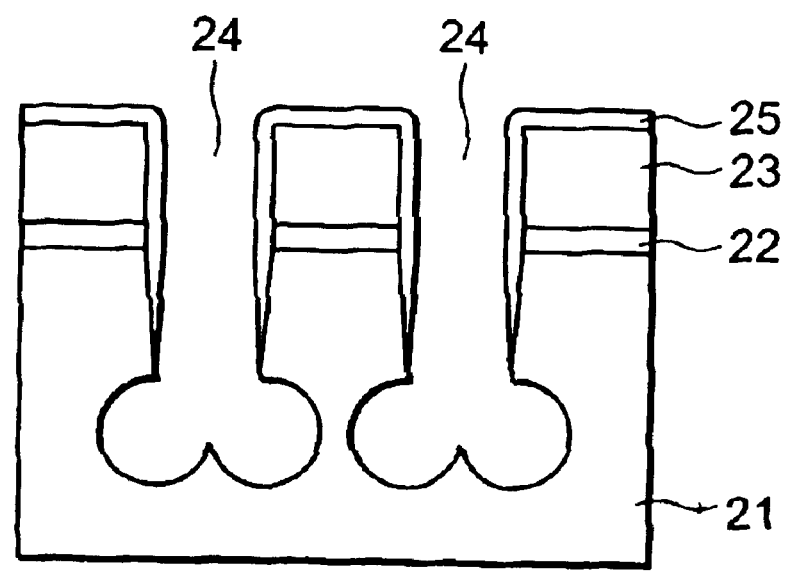
FIG. 5 is a process sectional view for forming a trench device isolation region in an SOI structure, which is used for describing a second embodiment of the present invention.
Figure 6:
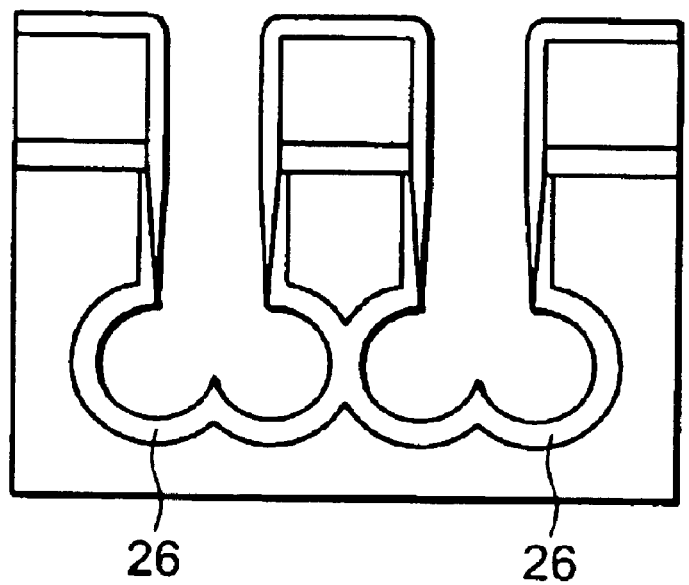
FIG. 6 is a process sectional view for forming the trench device isolation region in the SOI structure, which is used for describing the second embodiment of the present invention in succession to FIG. 5.
Figure 7:
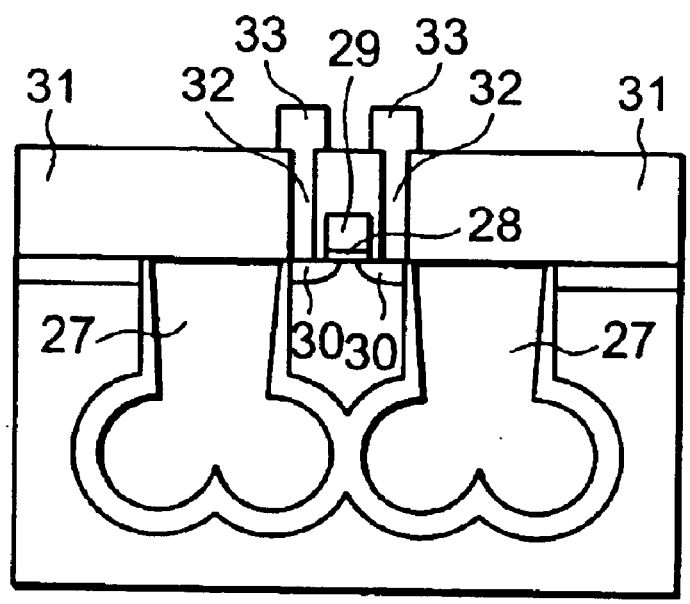
FIG. 7 is a process sectional view for forming the trench device isolation region in the SOI structure, which is used for describing the second embodiment of the present invention in succession to FIG. 6.

FIGS. 5 through 7 show a method of manufacturing a semiconductor device, according to a second embodiment of the present invention. Trench 24 are defined through a process perfectly similar to the first embodiment with a silicon thermal oxide film 22 and a silicon nitride film 23 formed on a silicon substrate 21 as masks. A thin silicon oxide film 25 is deposited over the whole surface of the silicon substrate 21, and silicon at trench bottom corner portions is isotropically etched (see FIG. 6).

Next, a thermal oxidation process is done to fully oxidize the silicon substrate 21 in each active region between the adjacent trench bottom corner portions. Thus, a resultant silicon thermal oxide film 26 insulates and separates the active regions and the silicon substrate 21 placed therebelow at the trench bottom corner portions. Since, at this time, the surface of the silicon substrate 21 is covered with the silicon oxide film 25 in the neighborhood of the surface in each trench, the thickness of the silicon thermal oxide film 26 that grows due to the oxidation of the silicon substrate 21, becomes thinner than the silicon thermal oxide film on each exposed surface (see FIG. 6).

Thereafter, a silicon oxide film 27 is deposited over the whole surface by a CVD method, and silicon oxide and nitride films 32 and 33 deposited over the silicon substrate 21 are removed by a CMP method and an etching method. Further, a MOS type transistor having a gate oxide film 28, a gate electrode 29 and source/drain diffusion layers 30, interlayer insulating films 31, contact holes 32 and connecting wirings 33 are formed by a process similar to the first embodiment (see FIG. 7).

According to the second embodiment as described above, a silicon substrate exposed at each trench bottom corner portion within each of trenches defined in the silicon substrate for the purpose of device isolation is isotropically etched and thermally oxidized, so that active regions and the silicon substrate can be insulated and separated from one another. Thus, devices can be perfectly separated from one another, and a so-called SOI (Silicon on Insulator) structure can be formed in a desired region on the silicon substrate. Forming the MOS type transistor in the perfectly-separated active region enables micro-fabrication, device-to-device high withstanding, speeding up and low power consumption of the transistor.

A silicon substrate is etched from corner portions at trench bottoms to increase the volume of each trench in a device isolation region, thereby making it possible to make long an effective device isolation distance between adjacent devices. It is therefore possible to enhance device isolation characteristics, i.e., a device isolation withstand voltage without impairing device micro-fabrication or scale-down.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A device isolation trench forming method, comprising the steps of:
    defining at least one trench in a silicon substrate;
    forming an insulating film inside the trench so that only each corner portion at the bottom of the trench is exposed; and
    selectively etching the silicon substrate from the corner portion.

2. The device isolation trench forming method according to claim 1, wherein the insulating film is a silicon oxide film.

3. The device isolation trench forming method according to claim 1, wherein the insulating film is a deposited film formed by a method selected from either a sputtering method or a CVD method.

4. The device isolation trench forming method according to claim 1, wherein the etching is isotropic etching.

5. The device isolation trench forming method according to claim 1, wherein the insulating film is formed inside the trench so that only the corner portions become thin and thereafter the silicon substrate at said each corner portion is exposed by etching.

6. The device isolation trench forming method according to claim 5, wherein the insulating film is a silicon oxide film.

7. The device isolation trench forming method according to claim 5, wherein the insulating film is a deposited film formed by a method selected from a sputtering method or a CVD method.

8. A device isolation trench forming method, comprising the steps of:
    forming a plurality of trenches adjacent to a silicon substrate;
    forming an insulating film inside the plurality of trenches so that only corner portions at bottoms of the plurality of trenches are exposed;

selectively etching the silicon substrate from the corner portions; and oxidizing the interiors of the plurality of trenches and insulating the plurality of trenches at the bottoms thereof by a silicon oxide film.

9. The device isolation trench forming method according to claim 8, wherein the insulating film is a silicon oxide film.

10. The device isolation trench forming method according to claim 8, wherein the insulating film is a deposited film formed by a method selected from a sputtering method or a CVD method.

11. The device isolation trench forming method according to claim 8, wherein the trenches are respectively device isolation trenches of an SOI type transistor.

12. The device isolation trench forming method according to claim 8, wherein the insulating film is formed inside the trenches so that only the corner portions become thin and thereafter the silicon substrate at said each corner portion is exposed by etching.

13. The device isolation trench forming method according to claim 12, wherein the insulating film is a silicon oxide film.

14. The device isolation trench forming method according to claim 12, wherein the insulating film is a deposited film formed by a method selected from a sputtering method or a CVD method.

* * * * *